United States Patent [19]

Kennedy

[11] 4,310,923

[45] Jan. 12, 1982

[54] TWO-WAY TRANSCEIVER INCLUDING FREQUENCY SYNTHESIZER

[75] Inventor: Edmund E. Kennedy, Shelbyville, Ind.

[73] Assignee: General Aviation Electronics, Inc., Indianapolis, Ind.

[21] Appl. No.: 23,240

[22] Filed: Mar. 23, 1979

[51] Int. Cl.³ .............................................. H01B 1/38
[52] U.S. Cl. ..................................... 455/79; 455/89; 455/90
[58] Field of Search .................................. 325/15–17, 325/21–22, 25, 419, 420, 453, 467, 468; 343/175, 176, 179, 180, 181; 455/77, 89, 90, 95, 98, 99, 175, 128, 178, 344, 345, 346, 347, 348, 349, 351

[56] References Cited

U.S. PATENT DOCUMENTS

| | | | |
|---|---|---|---|
| 2,731,555 | 1/1956 | Beck | 325/353 |
| 2,935,606 | 5/1960 | Harrison | 455/89 |
| 3,175,191 | 3/1965 | Cohn | 455/90 |
| 3,487,311 | 12/1969 | Luhowy | 325/17 |
| 3,970,782 | 7/1976 | Fenne | 325/353 |
| 3,983,484 | 9/1976 | Hodama | 325/21 |
| 4,027,242 | 5/1977 | Yamanaka | 325/17 |
| 4,034,164 | 7/1977 | Westmoland | 455/89 |
| 4,061,973 | 12/1977 | Reimers et al. | 325/17 |
| 4,070,626 | 1/1978 | Binder | 325/17 |
| 4,134,070 | 1/1979 | Henderson et al. | 325/355 |

OTHER PUBLICATIONS

CQ Reviews: The Kenwood TS–820 Transceiver, by H. Paul, CQ Radio, Feb., 1977, pp. 23–25 and 74, vol. 22, No. 2.

*Primary Examiner*—Jin F. Ng
*Assistant Examiner*—Tommy P. Chin
*Attorney, Agent, or Firm*—Shlesinger, Arkwright, Garvey & Dinsmore

[57] ABSTRACT

A two-way business-band transceiver for operation on an assigned FCC frequency includes a chassis housing a plurality of printed circuit boards which are surrounded by a three-part enclosure. This enclosure includes a main body portion having a top half and a bottom half and a control head portion which is separable from the main body portion. The transceiver circuitry which is arranged both within the main body portion as well as within the control head portion includes frequency synthesizing means which are selectable yet nonaccessible from the front of the control head portion. Frequency selection is accomplished by gaining access to a programming circuit portion which is located within the control head portion. This programming circuit portion includes a plurality of 10-position, rotary BCD switches which are arranged for channel 1 and channel 2 operation. By means of selective jumper placement, the transceiver may be arranged for either low-band operation or high-band operation and with each, an additional set of jumpers may be arranged for simplex operation or semi-duplex operation. The 100-MHz digit is preset at 1 and the 10-MHz digit is preset at 5 for each frequency setting, whether low band or high band, and for high-band operation, there is a 10.7-MHz offset factor which is effectively added to the switch setting for high-band operation. The frequency selection switches are not accessible by means of front panel controls and this prevents inadvertent frequency change yet the circuitry still provides the benefits of frequency synthesizing.

10 Claims, 9 Drawing Figures

TWO-WAY TRANSCEIVER INCLUDING FREQUENCY SYNTHESIZER

BACKGROUND OF THE INVENTION

This invention relates in general to business-band transceivers, and in particular to such transceivers which include frequency-synthesizing means.

Business-band transceivers are typically employed for two-way communications involving public safety, industrial and business-related situations. Often it is a base station which must communicate with remote vehicles in the field in order to dispatch such vehicles to selected destinations. In order to monitor and control the use of various transmitting and receiving frequencies and to preserve some degree of privacy and isolation among various transceiver users, the Federal Communications Commission (FCC) assigns a single frequency to the business or service and in some cases a larger business may be assigned two frequencies.

When a unique crystal must be employed in order to achieve the FCC assigned frequency, the continued operation of the transceiver becomes completely dependent upon the presence of such a crystal. Consequently, in the event the crystal is damaged, lost or otherwise becomes unserviceable, the transceiver may be "lost" from service for extended periods of time while a new, unique crystal is ordered. In order to overcome this crystal replacement disadvantage, certain transceiver designs have gone to the use of a single crystal in combination with some type of frequency synthesizer so that the transceiver is not crystal-dependent to a unique crystal. That is, a variety of crystals are acceptable to create the assigned frequency and once a crystal is selected, the frequency synthesizer is changed accordingly. Frequency synthesizing also permits a repair shop to loan out a radio while a business's radio is being repaired and all that is required is to set the frequency synthesizer of the "loaner" so that the operating frequency of the transceiver corresponds to the assigned frequency for the particular business. One problem with frequency-synthesizing receivers is the inability to prevent inadvertent frequency change by the user. This result can easily occur when the controls for frequency setting are front panel controls and are readily accessible.

While there are a wide variety of transceiver designs, the following patents and publications represent a sampling of design concepts and available products.

| Patent No. | Patentee | Issue Date |
| --- | --- | --- |
| 3,487,311 | Luhowy | 12/30/69 |
| 3,983,484 | Hodama | 9/28/76 |
| 4,027,242 | Yamanaka | 5/31/77 |
| 4,061,973 | Reimers et al. | 12/06/77 |
| 4,070,626 | Binder et al. | 1/24/78 |

| Publication for Model No. | Manufacturer |
| --- | --- |
| TR-7400A | Kenwood |
| FM-28 | Clegg Communications Corp. |
| TS-700SP | Trio-Kenwood Communications, Inc. |

Luhowy discloses a transceiver with tunable phase-lock oscillator and tuning voltage generator. The local oscillator stage of this transceiver can be phase-locked to any one of a wide band of frequencies applied thereto from a digitally-tunable frequency synthesizer. The oscillator is course tuned by the same mechanism which tunes the synthesizer.

Hodama discloses a multichannel signal transmitting and receiving apparatus which comprises a single-reference local oscillator, a phase-locked loop including a phase comparator receiving as one input a signal resulting from a frequency division of the output of the local oscillator and a voltage-controlled oscillator. The single local oscillator is used for both signal reception and signal transmission and a frequency converter is provided outside of the loop of the phase-locked loop.

Yamanaka discloses a double superheterodyne receiver having a single local oscillator which supplies a signal of a predetermined frequency to a second frequency converter or mixer where a second intermediate frequency signal is produced for final detection. The local oscillator signal is also supplied by way of a frequency divider to a phase-locked loop frequency synthesizer as a reference frequency signal.

Reimers et al. discloses a synthesizer which employs phase-lock loop techniques to generate either the carrier signal for an associated transmitter or the injection signal for an associated receiver. A programmable divider controls the specific channels to which the synthesizer tunes the transmitter or receiver whereas operation of the transmit or receive mode is dependent upon which one of two oscillators is coupled to the synthesizer circuit.

Binder et al. discloses a radio-telephone device which includes a channel selector containing at least one frequency divider having a plurality of control inputs each associated with a respective frequency dividing ratio and each arranged to receive an electrical signal for influencing its frequency dividing ratio.

The Kenwood model TR-7400A is a two-meter transceiver which provides front panel controls for selection of one of its 800 channels. The Clegg model FM-28 is also a two-meter transceiver which provides front-panel frequency select controls. The Trio-Kenwood model TS-700SP includes a plug-in crystal as well as the previously mentioned front panel controls for frequency selection. While each of the various transceivers may provide certain advantages, they do not overcome the disadvantage of placing the frequency-select controls in an accessible location where the frequency can be easily, though inadvertently, changed.

SUMMARY OF THE INVENTION

A two-way business-band transceiver for operation on an FCC assigned frequency according to one embodiment of the present invention comprises enclosing means having a main body portion and a control head portion separable from the main body portion, a transceiver circuit arranged within the enclosing means and including frequency-synthesizer means, the transceiver circuit including a frequency adjusting circuit portion disposed within the control head portion and having manually-selectable frequency means for selecting a desired one of several possible channel frequencies.

One object of the present invention is to provide an improved two-way business-band transceiver with frequency-synthesizing means.

Related objects and advantages of the present invention will be apparent from the following description.

DESCRIPTION OF THE PREFERRED EMBODIMENT

Figure 1:
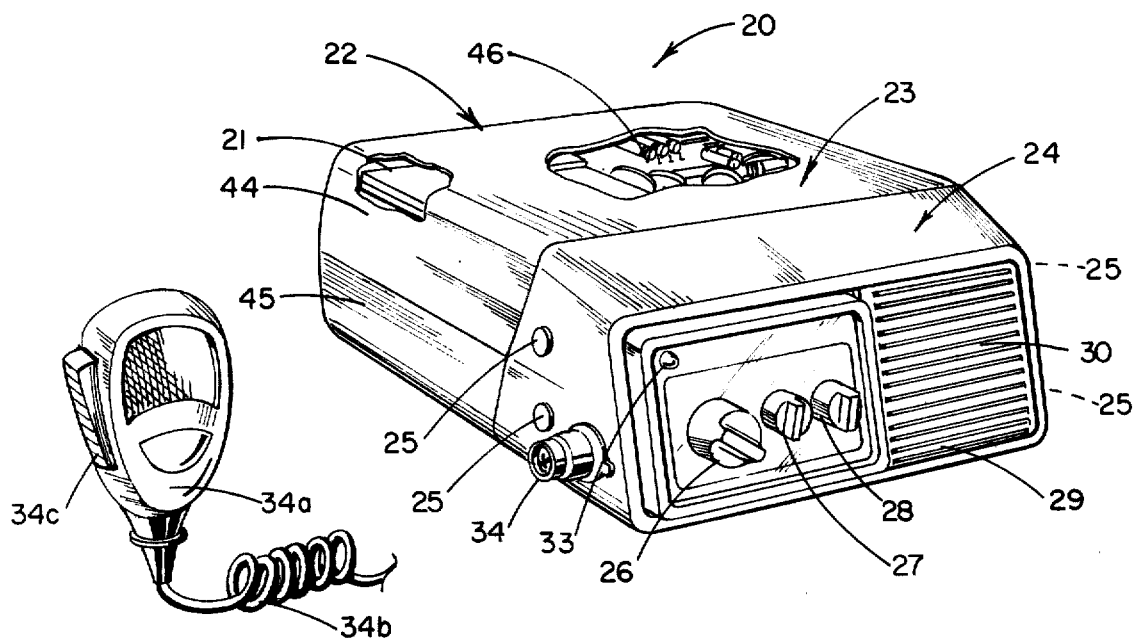
FIG. 1 is a fragmentary, perspective view of a two-way business-band transceiver according to a typical embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, and that it includes such alterations and further modifications in the illustrated device, and such further applications of the principles of the invention as illustrated therein as would normally occur to one skilled in the art to which the invention relates.

Referring to FIG. 1, there is illustrated a two-way business-band transceiver 20 which includes the necessary transceiver circuitry as well as frequency-synthesizing means. The mechanical package of transceiver 20 includes an internal chassis 21 which is surrounded and encased by enclosure 22. Enclosure 22 includes a main body portion 23 and a control head portion 24 which is detachably secured to internal chassis 21 by means of two threaded fasteners 25 located on each side of control head portion 24. By first loosening and then removing the total of four threaded fasteners 25, control head portion 24 is separable from main body portion 23.

Disposed on the outwardly facing surface of control head portion 24 are front panel controls 26, 27 and 28. Control 26 includes an internal rotary switch in combination with the outwardly visible knob and there are two switch positions corresponding to either a channel 1 or a channel 2 selection, which will be explained hereinafter. Similarly, control 27 includes an ON/OFF switch and volume control and while only the knob is outwardly visible, the associated electronics are disposed within control head portion 24. Front panel control 28 represents the final external control of transceiver 20 and this control includes a rheostat within control head portion 24 and corresponds to squelch control. Control head portion 24 also includes a speaker 29 (see FIG. 3), a speaker grill 30, a transmit indicator lamp 33 and a microphone connector 34. Also illustrated, but detached from control head portion 24, is microphone 34a and cable 34b.

Figure 3:
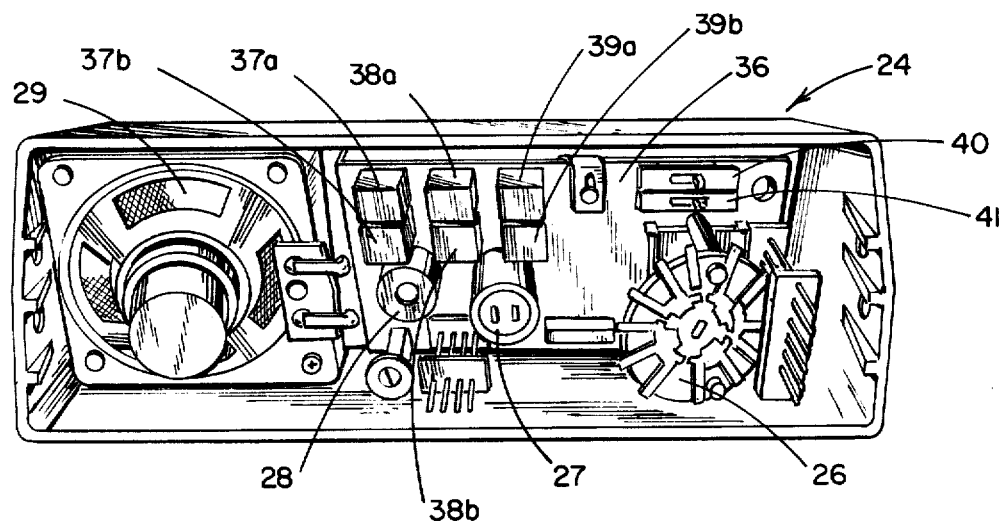
FIG. 3 is a rear elevation view of the FIG. 2 control head as taken along line 3—3 in FIG. 2.
Figure 2:
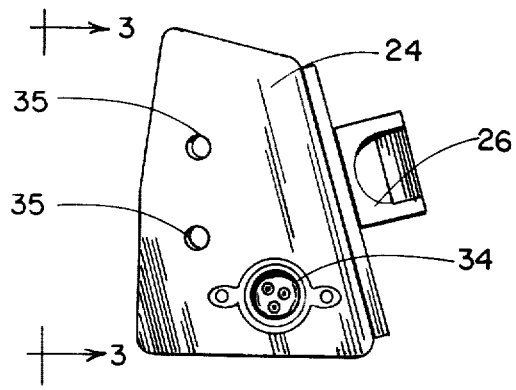
FIG. 2 is a side elevation view of a control head comprising a portion of the FIG. 1 transceiver.

Referring to FIG. 2, control head portion 24 is illustrated as a side elevation view with threaded fasteners 25 removed and the control head portion separated from the remainder of the transceiver, namely from main body portion 23. The removal of threaded fasteners 25 leaves two clearance holes 35 on each side, and due to the locations and respective sizes of the various front panel control knobs, only the knob associated with channel select control 26 is visible in this view. By looking in at the rear of control head portion 24, that portion of the transceiver circuitry which is located within control head portion 24 is visible and is illustrated in FIG. 3. This circuitry includes a speaker 29 and a printed circuit board 36 which incorporates the various front panel control switches and rheostats as well as the necessary circuitry for frequency selection and mode of operation. Printed circuit board 36 will hereinafter be referred to as frequency adjusting board 36 in that frequency adjusting is accomplished by means of six 10-position, rotary BCD switches 37a, 37b, 38a, 38b, 39a and 39b and by two 2-position SPDT slide switches 40 and 41 all of which are mounted on frequency adjusting board 36. While various circuitry components may be omitted from the FIG. 3 illustration, a circuit schematic of adjusting board 36 is provided in FIG. 6. as well as block representations for other relevant electrical portions associated with the overall operation of the transceiver.

Transceiver 20 is internally frequency adjusting for operation in various modes. Transceiver 20 may be adjusted for operation in the low band on one of two simplex frequency channels. Similarly, transceiver 20 may alternately be adjusted in the high band for operation on one of two simplex channel frequencies. A further mode involves the operation in the low band on one semi-duplex frequency channel and similarly transceiver 20 may be adjusted in the high band to operate on yet another semi-duplex channel frequency. When the transceiver is adjusted for operation on one of the two simplex channels, the channel-select switch, control 26, is utilized. However, when the transceiver's mode of operation is switched to the semi-duplex channel, whether low band or high band, the front panel channel-select switch, control 26, is disabled. The rewiring of frequency adjusting board 36 will be described in greater detail hereinafter.

The term "simplex" refers to a mode of operation wherein transmitting and receiving are performed on the same frequency and thus either one or the other may occur, but both cannot occur simultaneously. The term "semi-duplex" refers to a mode of operation wherein transmitting occurs on one frequency and receiving occurs on a different frequency. While both may occur simultaneously in duplex mode, it is a requirement of transceiver 20 that the microphone transmit button 34c be depressed when transmitting in order to effect this semi-duplex mode of operation.

Figure 5:
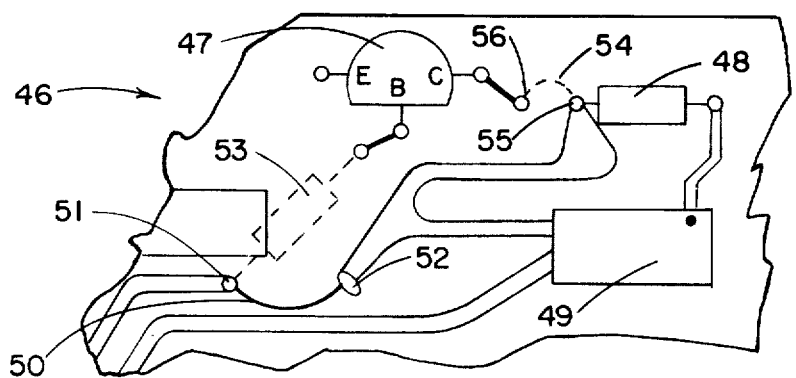
FIG. 5 is a diagrammatic view illustrating the alternative wiring arrangements for different modes.
Figure 5A:
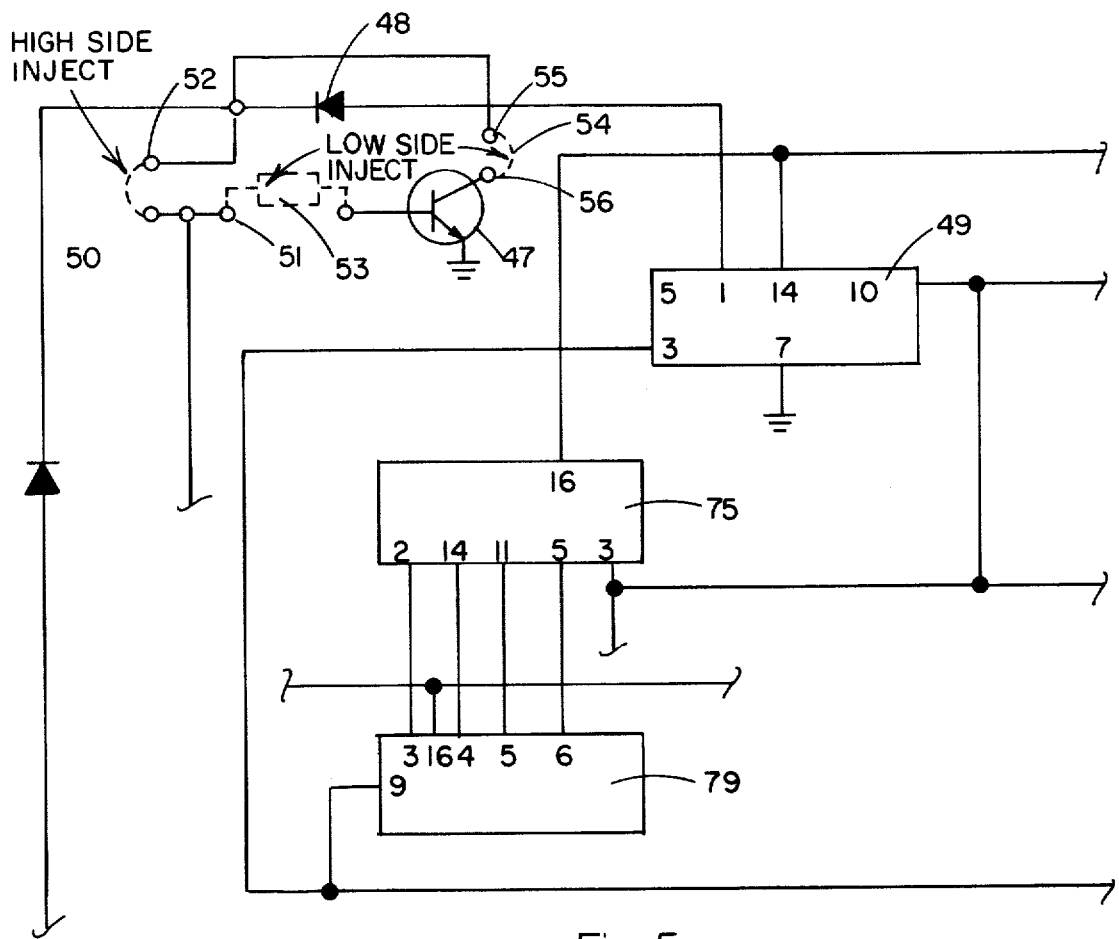
FIG. 5a is a partial schematic diagram of the FIG. 5 component arrangement.
Figure 7:
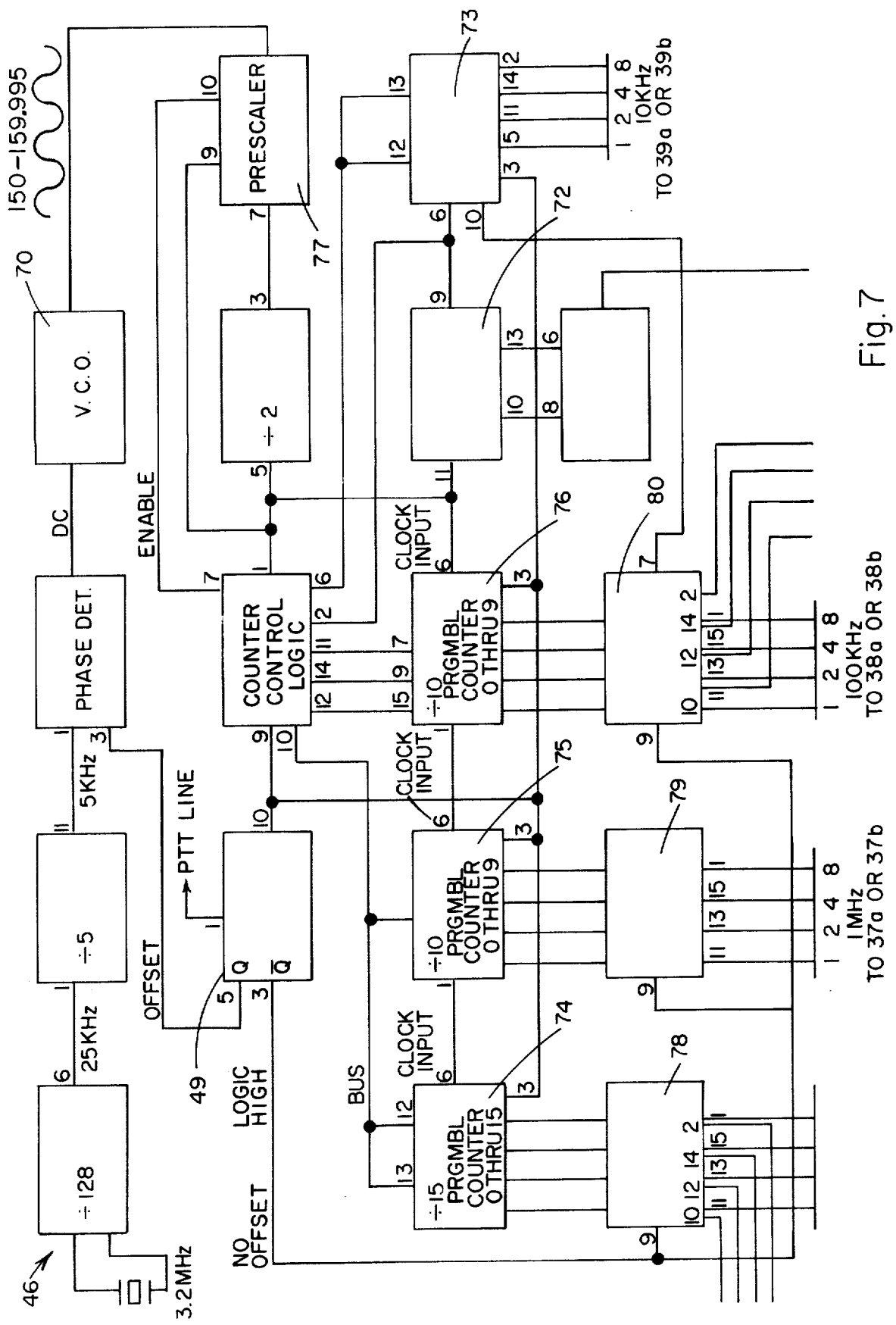
FIG. 7 is a block diagram of synthesizer circuitry comprising a portion of the FIG. 1 transceiver.

Main body portion 23 of transceiver enclosure 22 is arranged into a top half 44 and a bottom half 45 which are separable from each other independently. With top half 44 removed, access is allowed to synthesizer printed circuit board 46. A portion of synthesizer board 46 is illustrated in FIG. 5 wherein only a few of the components are indicated and these components are those which are utilized for conversion from either low band to high band or from high band to low band, regardless of whether transceiver 20 is being operated on one of the two simplex channels or on the semi-duplex channel. FIG. 5a is a partial schematic diagram corresponding to the FIG. 5 component arrangement and should be amplified and expanded upon by further reference to FIG. 7. Included within this disclosed circuitry is transistor 47 with the emitter, base and collector terminals identified, diode 48 and integrated circuit 49. A suitable component for integrated circuit 49 in this circuit is an MC12020L offset control offered by Motorola Semiconductor Products Inc. of Tempe, Arizona. For low-band operation, jumper 50 is connected between printed circuit pads 51 and 52, and in this low band mode, resistor 53 is omitted as is jumper 54. However, when converting this synthesizer board into a high-band mode of operation, jumper 54 is added between printed circuit pads 55 and 56, resistor 53 is added between the base of transistor 47 and printed circuit pad 51 and jumper 50 is removed. The low-band frequency ranges from 150.0 to 159.995 MHz and the high band ranges from 160.7 to 170.695 MHz. Transceiver 20 must be adjusted so that all transmit/receive frequencies, either simplex or semi-duplex, are in the same frequency band. With this understanding of low-band and high-band frequency adjusting, the frequency selection procedure will now be explained.

Figure 4:
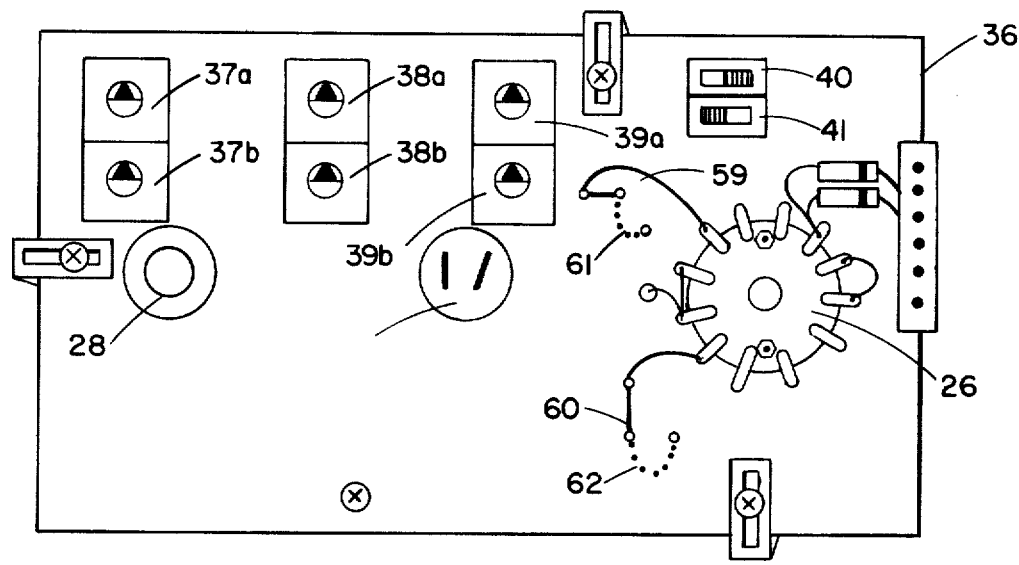
FIG. 4 is a plan view of the component side of a frequency adjusting board comprising a portion of the FIG. 2 control head.

Referring to FIG. 4, frequency adjusting board 36 is illustrated in greater detail and diagrammatically represents the various components associated with this board. The top row of rotary BCD switches 37a, 38a and 39a correspond to channel 1 while the bottom row of switches 37b, 38b and 39b correspond to channel 2. In order to adjust or set these various frequency switches to the desired frequency for channel 1, for example, 154.315 MHz, proceed in the following manner. The 100-MHz digit and the 10-MHz digit are preset and hard wired in at the values of 1 and 5 respectively as will be explained hereinafter. This presetting is possible since the low-band frequency range is from 150.0 to 159.995 MHz and thus a one and a five in the first two digit locations are always required. Therefore, there is no selection required for these digits. Using a slotted alignment tool or similar implement, rotate switch 37a (the 1-MHz digit) so that its arrow indicator points to "4." Next, using this same slotted tool or implement, rotate switch 38a (the 100-KHz digit) so that it indicates "3." Next, rotate switch 39a (the 10-KHz digit) so that it indicates "1." Now slide switch 40 to the extreme left-hand side and this provides the five KHz digit. The resultant frequency which is now set for channel 1 is the desired 154.315 MHz frequency. A similar procedure may be followed for channel 2 using switches 37b, 38b, 39b and 41.

Figure 4A:
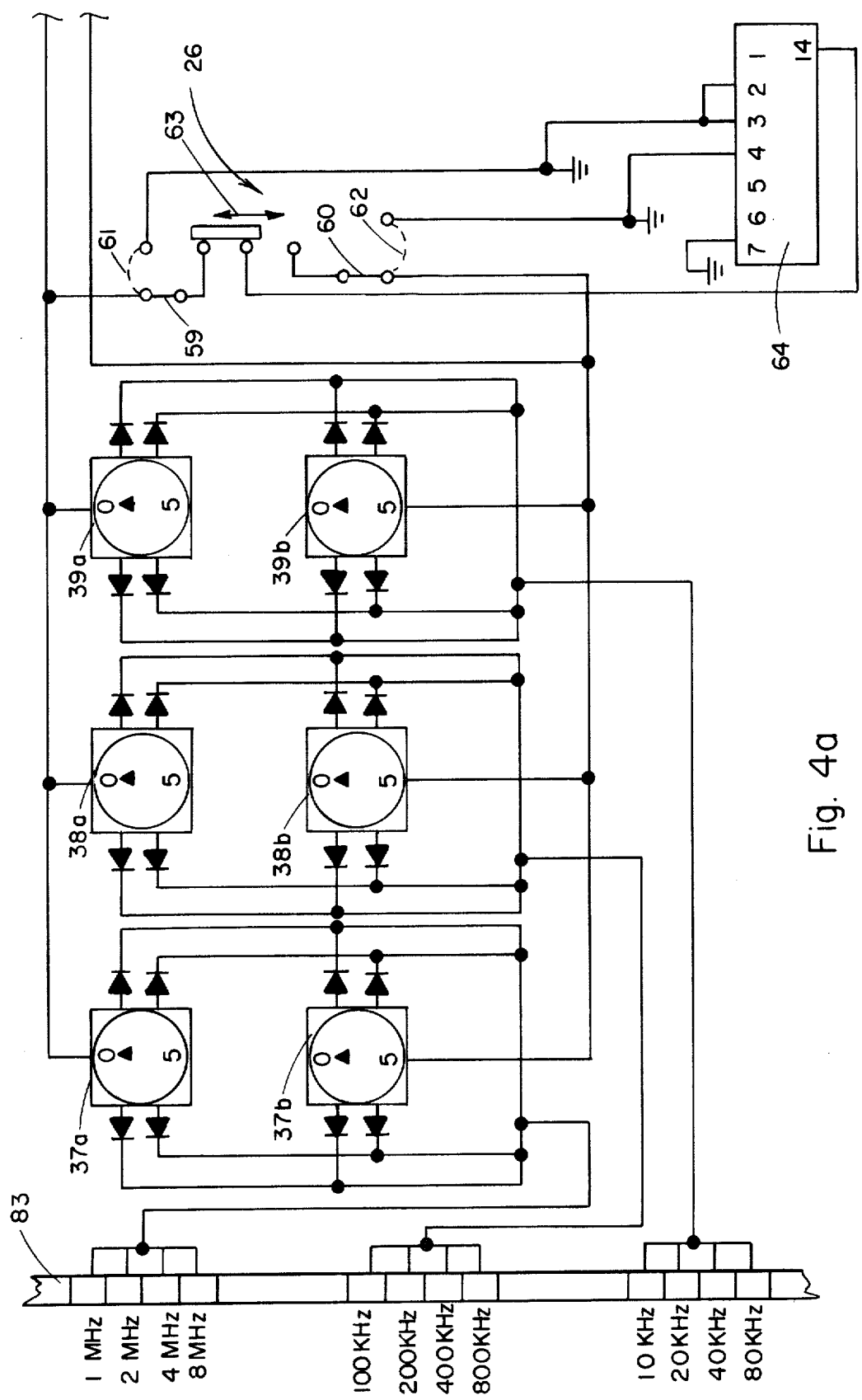
FIG. 4a is a partial schematic diagram of the FIG. 4 component arrangement.

Referring to FIG. 4a, there is illustrated a partial schematic diagram corresponding to the component layout of FIG. 4. One part of connector 83 is illustrated and this connector provides the frequency inputs from the synthesizer board to the various rotary switches. Jumpers 59, 60, 61 and 62 are all illustrated yet it is to be understood that these jumpers are selectively added to or deleted from the circuit depending on whether simplex or semi-duplex is desired. Channel select switch 26 is included and arrow 63 represents the switching action from one channel to the other. A suitable component for integrated circuit 64 in this circuit is an MC7404 hex inverter offered by Motorola Semiconductor Products, Inc. of Tempe, Arizona.

Of course, since two-channel utilization is only appropriate for the simplex mode of operation, there is a further adjustment which must be made to distinguish between simplex and semi-duplex modes. For the simplex mode, it is required that jumpers 59 and 60 are installed from channel-select switch, control 26, to frequency adjusting board 36, as illustrated, and that jumpers 61 and 62 are omitted. When frequency adjusting for a semi-duplex frequency, the same low-band and high-band jumper arrangement as previously described for the synthesizer board 46 is followed, yet there is a difference on frequency adjusting board 36 with respect to jumpers 59, 60, 61 and 62. In the event the semi-duplex mode is desired rather than the simplex mode, jumpers 61 and 62 are installed and jumpers 59 and 60 are removed. The removal of jumpers 59 and 60 thereby disables the channel-select switch, control 26. In the semi-duplex mode, switches 37a, 38a, 39a and 40 are used to set the "transmit" frequency while switches 37b, 38b, 39b and 41 are used to set the "receive" frequency.

When frequency adjusting the two simplex channel frequencies in the high band, there is a slightly different procedure in addition to the rewiring of the synthesizer board 46 as previously described. Once the desired frequency to be adjusted into the receiver has been determined, the next step is to subtract 10.7 MHz from the frequency desired. The subtraction of the 10.7 MHz factor reduces the high-band frequency which has a range of 160.7 to 170.695 MHz back to a representation range of 150.0 up to 159.995 MHz which interestingly corresponds to the low-band frequency range. Therefore, the prewiring of the 1 and 5 digits corresponding to the 100 MHz and the 10 MHz digits is equally applicable for high-band as well as for low-band operation. The 10.7 MHz factor is in essence added by other circuitry such that if the desired high-band frequency is 167.895 MHz, the subtraction of 10.7 MHz reduces this value to 157.195 MHz and that is the value set on the appropriate set of switches, depending upon the channel. Then when the 10.7 MHz factor is added back in, the effective frequency is the 167.895 MHz that was initially desired.

Figure 6:
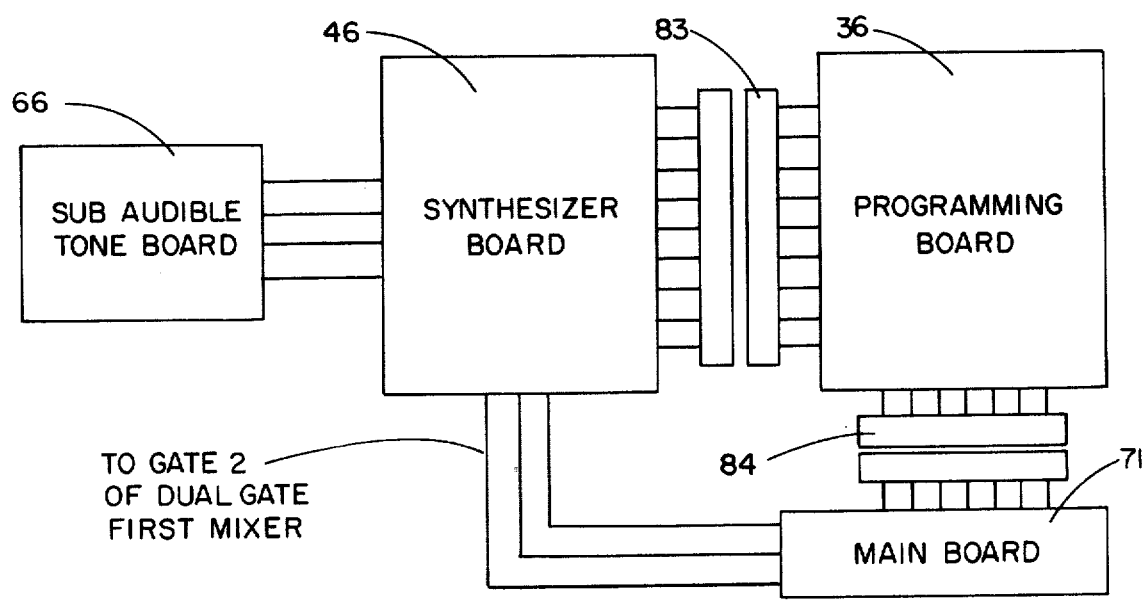
FIG. 6 is a circuit schematic of the frequency adjusting board and other related electronics associated with the FIG. 1 transceiver.

The incorporation of this 10.7 MHz offset factor is achieved by the use of a series of integrated circuits hard wired as part of the transceiver circuitry. The following description of the circuitry of the synthesizer board 46 (see FIGS. 5, 6 and 7) should clarify the creation and utilization of this 10.7 MHz offset. Integrated circuit 70 (FIG. 7) is a voltage-controlled oscillator (VCO) which produces the VHF signal for the synthesizer. The VCO output is amplified, buffered and then applied to the receiver and transmitter sections of the main printed circuit board 71 (FIG. 6). The synthesizer consists of two groups of counters. The first group of counters includes integrated circuits 72 and 73 and the second group of counters includes integrated circuits 74, 75 and 76. The VCO frequency is increased by 10.7 MHz for "high-band" transmit and "low-band" receive functions by utilizing offset-programming integrated circuits 78, 79 and 80. These integrated circuits provide a digital means of increasing frequency. Offset programming integrated circuits 78, 79 and 80 consist of a logic implementation of a four-pole, two-position switch controlled by the "enable input" from integrated circuit 49, pin 3. Each integrated circuit has two groups of inputs. One group consisting of pins 1, 13, 15 and 11 determine the transmission frequency, and is programmable with either logic state of the "enable" line. The other input group consists of pins 10, 12, 14 and 2 and determine the offset frequency, which in the exemplary embodiment is 10.7 MHz and which is controlled by the "enable" line.

A logic "1" corresponds to no offset while a logic "0" corresponds to the 10.7 MHz offset factor. In operation when the PTT line at pin 1 of integrated circuit 49 is a logic "0", the integrated circuit becomes a buffer gate that follows the clock input at pin 10. The $\overline{Q}$ line (pin 3) of integrated circuit 49 produces a constant logic "1" which does not enable the frequency offset. A logic "1" on PTT line at pin 1 of integrated circuit 49 turns integrated circuit 49 into a flip-flop and divides by two both the Q and the $\overline{Q}$ outputs at pins 5 and 3, respectively. This switching logic allows the 10.7 MHz frequency factor offset information to be "hard wired" at input pins 10, 12, 14 and 2 of integrated circuits 78, 79 and 80 and to be enabled and coupled into programmable counter integrated circuits 74, 75 and 76. Transistor 47 is used to invert the logic signal at the PTT input (pin 1) of integrated circuit 49 when transceiver 20 is used on the high band. A suitable component for each one of integrated circuits 75, 76 and 73 in this circuit is an MC4016P programmable decade counter. A suitable component for each one of integrated circuits 78, 79 and 80 in this circuit is an MC12021P offset programmer. A suitable component for integrated circuit 74 in this circuit is an MC4018P programmable hexadecimal. A suitable component for integrated circuit 77 in this circuit is an MC12013AL prescaler. Each of these components are offered by Motorola Semiconductor Products, Inc. of Tempe, Arizona.

FIG. 6 is a circuit schematic of the frequency adjusting board 36 and discloses the various connections between the previously described switches and various front panel controls. It is to be noted that one set of wires go to connector 83 while a separate set go to connector 84 and a third set ties into microphone connector 34. One connecting line between synthesizer board 46 and main board 71 has been identified and corresponds to the injection signal. In order for transceiver 20 to receive between 150.0 and 159.995 MHz, the injection frequency is 10.7b MHz above the desired "receive" frequency, while to receive frequencies between 160.7 and 170.695 MHz, the injection frequency is 10.7 MHz below the desired "receive" frequency. The remainder of FIG. 6 includes a block diagram representation of the remaining functional circuit blocks of transceiver 20 and inasmuch as the basic operation of such circuitry is well known in the art, additional details over what has previously been described herein is not believed to be necessary for a full and complete understanding of the disclosed and claimed invention. In addition to frequency adjusting board 36 and synthesizer board 46 there are also included as part of transceiver 20 a main board 85 and a subaudible-tone board 86.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A two-way business-band transceiver, comprising: a transceiver housing enclosing a transceiver circuit, a separable control head portion integral with the housing and containing controls including a channel-select switch with an external select knob for selecting one of a plural number of channels each having a plural digit frequency, a set of plural individually adjustable frequency selection elements for each channel frequency, each of which controls the value of a different digit of that frequency, the adjustable frequency selection elements being disposed within the control head portion of the housing and being inaccessible from outside the housing, the elements being positioned therein for convenient adjustment of their digit values to provide an internal adjustable multi-frequency changing capability for the external manual channel-select switch, the transceiver circuit including a high-band frequency offset circuit means for providing an incremental frequency change from a first frequency setting located in the low-band range to a setting in the high-band frequency range.

2. The business-band transceiver of claim 1 wherein said transceiver circuit includes means for providing frequency operation of said transceiver on either of two simplex channels or on one semiduplex channel.

3. The business-band transceiver of claim 1 wherein said adjustable frequency elements are a plurality of rotary switches, each of said rotary switches corresponding to a particular frequency value digit and having a plurality of switch positions, each of said switch positions corresponding to a different value for said digit.

4. The business-band transceiver of claim 1 wherein the transceiver circuit includes as part thereof, means for giving assigned fixed digit values for the 100-MHz digit and the 10-MHz digit of the desired frequency.

5. The business-band transceiver of claim 1 wherein the transceiver circuit includes as part thereof means for giving assigned digit values for the 100-MHz digit and the 10-MHz digit of the desired frequency.

6. The business-band transceiver of claim 5 wherein said control head portion is open at its interface with said main body portion and said adjustable frequency selection elements are arranged on a printed circuit board wherein the component side is positioned in a rearwardly-facing orientation such that said plurality of rotary switches are accessible for manual position selection once said control head portion is separated from said main body portion.

7. The business-band transceiver of claim 6 wherein said transceiver circuit includes electric jump wire means for connecting different interacting circuit logic elements of the transceiver to provide for either high-band or low-band operation.

8. The business-band transceiver of claim 1 wherein the only front panel controls of said transceiver include a channel select control, ON/OFF-volume control and squelch control.

9. The business-band transceiver of claim 1 wherein said high-band frequency offset circuitry means has a value of 10.7 MHz.

10. The business-band transceiver of claim 1, where the same preset control circuitry is provided for both the first and the second digits of the desired frequency for both the high and low bands.

* * * * *